(12) United States Patent
Borst

(10) Patent No.: US 8,154,312 B2
(45) Date of Patent: Apr. 10, 2012

(54) SENSOR SYSTEM

(75) Inventor: Holger Borst, Buehlertal (DE)

(73) Assignee: Robert Bosch GmbH, Stuttgart (DE)

( * ) Notice: Subject to any disclaimer, the term of this patent is extended or adjusted under 35 U.S.C. 154(b) by 549 days.

(21) Appl. No.: 11/887,787

(22) PCT Filed: Apr. 5, 2006

(86) PCT No.: PCT/EP2006/061331
§ 371 (c)(1),
(2), (4) Date: Aug. 18, 2009

(87) PCT Pub. No.: WO2006/106111
PCT Pub. Date: Oct. 12, 2006

(65) Prior Publication Data
US 2009/0295413 A1   Dec. 3, 2009

(30) Foreign Application Priority Data
Apr. 8, 2005 (DE) .......................... 10 2005 016 127

(51) Int. Cl.
*G01R 27/08* (2006.01)
(52) U.S. Cl. ...................................................... 324/713
(58) Field of Classification Search .................. None
See application file for complete search history.

(56) References Cited

U.S. PATENT DOCUMENTS
2004/0189323 A1   9/2004   Nagase

FOREIGN PATENT DOCUMENTS
FR   2 758 626           7/1998
FR   2758626 A1   *     7/1998
JP   5107292              4/1993
JP   2003304633         10/2003

* cited by examiner

*Primary Examiner* — Paresh Patel
(74) *Attorney, Agent, or Firm* — Kenyon & Kenyon LLP

(57) ABSTRACT

A sensor system having a sensor unit for detecting a measured variable, and an evaluation unit, which are interconnected via at least one or a plurality of connection line(s), the sensor unit having a sensor, which is connected to a supply voltage, and includes a signal output for a measuring signal that is a function of the measured variable, the evaluation unit having a voltage meter to detect the status of the measured variable as a function of a potential, the sensor unit including a first resistive circuits connected to the sensor, and the evaluation unit including a second resistive circuit connected to the voltage meter. The first and the second resistive circuits are coupled to one another via at least the sensor line and forming a resistor network. The first and the second resistive circuit are configured so that, in a fault-free state of the one or the plurality of connection line(s), the voltage meter detects one or a plurality of measuring potential(s) in one or a plurality of defined measuring potential range(s) as a function of the measured variable, and, in a fault case, it detects a measuring potential that lies within a fault potential range. The first and the second resistive circuits are dimensioned so that the fault potential range lies outside of the one or the plurality of defined measuring potential range(s).

10 Claims, 3 Drawing Sheets

SENSOR SYSTEM

FIELD OF THE INVENTION

The present invention relates to a sensor system having a sensor unit as well as an evaluation unit disposed physically separate therefrom, both units being interconnected via at least one sensor line.

BACKGROUND INFORMATION

Electronic systems often have an evaluation unit for providing measuring signals to be processed in the system. Typically, the evaluation unit is part of a control and regulation system and connected to a sensor unit, which is disposed at a distance from the system, via one or a plurality of connection lines. Under rough operating conditions as they may occur in a motor vehicle, for example, the connection line between the evaluation unit and the sensor unit can be interrupted or short-circuited with other connection lines. This could lead to a malfunction of the system without the fault being detected if the measured variable supplied by the sensor unit is plausible.

The safety during operation of the system having the evaluation unit and the external sensor unit is able to be increased by performing a diagnosis of the connection line with regard to the aforementioned faults. To this end, a voltage measured on the connection line is usually subjected to a plausibility check. To determine a line break on the sensor supply, i.e., on the corresponding connection lines carrying the supply voltage, the voltage drop, for instance, is monitored via a measuring resistor (shunt) lying in the connection line. In a correct connection, the supply current of the sensor unit causes a voltage drop, which is able to be measured. If the voltage drop is missing, then an interrupted line can be assumed. If the voltage is too high downstream from the resistor, provided the sensor unit has a lower supply voltage than the evaluation unit of the overall system, then this indicates a short circuit downstream from the voltage supply of the evaluation unit. If the measured voltage is too low, then a short circuit to a ground potential is present. With the aid of a corresponding wiring configuration with resistors, the voltage range of the output of the sensor unit is limited to values greater than 0 V (ground potential) and smaller than the supply voltage of the sensor unit, in order to be able to distinguish the normal operation from short circuits to ground and the supply voltage of the sensor unit or the evaluation unit.

Due to tolerances of the supply current of the sensor unit and tolerances of the resistor of the supply lines and the sensor unit over the service life and temperature, a marked voltage drop results at the measuring resistor, which could lead to high power losses in the measuring resistor in the supply line, so that large components, which can accommodate a correspondingly high output, must be employed. Furthermore, a measuring resistor and a corresponding measuring channel for each connection line to be diagnosed are required in the evaluation unit. This typically entails extra work and expense, and the overall device requires considerable space.

It is the object of this invention to provide a sensor system having an evaluation unit and an external sensor unit, which has a simple configuration and is able to detect interruptions of connection lines in a reliable manner and with a minimum of circuit expenditure.

This object is achieved by the sensor system as described herein.

Further advantageous refinements of the present invention are specified herein.

SUMMARY OF THE INVENTION

According to the exemplary embodiments and/or the exemplary methods of the present invention, a sensor system having an evaluation unit and a sensor unit for detecting a measured variable is provided, the sensor unit being disposed remotely therefrom. The sensor unit and the evaluation unit are interconnected via one or a plurality of connection line(s). The sensor unit is provided with a sensor, which is connected to a supply voltage and includes a signal output for a measuring signal that is a function of the measured variable. The evaluation unit has a voltage detector in order to detect the status of the measured variable as a function of a potential.

The sensor unit includes a first resistive circuit, which is connected to the sensor, and the evaluation unit includes a second resistive circuit, which is connected to the voltage detector. The first and second resistive circuits are coupled to one another via the one or the plurality of connection line(s) and form a resistor network. The first and second resistive circuit are configured in such a way that, in a fault-free state of the one or the plurality of connection line(s) of the sensor system, the voltage detector detects one or a plurality of measuring potential(s) in one or a plurality of defined measuring potential range(s) as a function of the measured variable, and, in a fault case, it detects a measuring potential that lies in a fault potential range. The first and the second resistive circuit are dimensioned such that the fault potential range lies outside of the one or the plurality of defined measuring potential range(s).

With the aid of the resistive circuits provided in the sensor unit and also in the evaluation unit, the present sensor system readily allows the definition of measuring potential ranges and fault potential ranges that differ therefrom, which make it possible to record the status of the measured variable using a measurement, or—if a fault has occurred on the one or the plurality of connection line(s)—to detect this fault on the basis of the associated fault potential range and to identify it. According to the exemplary embodiments and/or the exemplary methods of the present invention, this is achievable with the aid of only one voltage detector in the evaluation unit, so that the configuration of the sensor system is able to be implemented in an uncomplicated and space-saving manner.

According to one specific embodiment of the present invention, the first and/or the second resistive circuit are/is configured as resistor chain.

The first and the second resistive circuit may be configured such that, in a plurality of fault cases, it is detectable by a plurality of measuring potentials in a corresponding plurality of fault potential ranges in order to detect the type of the particular fault case.

In particular, the first and the second resistive circuit may be configured in such a way that, in the event of an interruption in one of the connection lines, the voltage meter detects a measuring potential that lies in a particular fault potential range assigned to the fault type.

According to one specific embodiment of the present invention, the sensor unit and the evaluation unit are interconnected via a sensor line and a first and second supply line. In this manner a supply voltage is supplied to the sensor unit via the evaluation unit, and the sensor unit is able to provide the corresponding measuring value to the evaluation unit via the sensor line.

Furthermore, the first and the second resistive circuit may each be configured as resistor chain, the resistor chains being connected to each other at different nodes via the sensor line and the first and second supply line. The resistor network has resistor elements that are dimensioned such that, in the event of an interruption in one of the connection lines, the measuring potential is set to the corresponding fault potential range.

According to a specific embodiment, the first resistive circuit has a first, a second, and a third resistor element, which are connected in series between the first supply line and the second supply line. A first node between the first and second resistor element is connected to the sensor line, and a second node between the second and the third resistor element is connected to the signal output of the sensor.

Furthermore, it may be provided that the second resistive circuit includes a fourth, a fifth, and a sixth resistor element, which are connected in series between the first supply line and the second supply line, a third node between the fourth and the fifth resistor element is connected to the sensor line, and a fourth node between the fifth and the sixth resistor element is connected to the voltage meter.

The first through sixth resistor elements may be dimensioned such that the faults caused by an interruption in one of the connection lines is able to be identified unambiguously on the basis of the fault potential range in which the measuring potential is measured.

According to one specific embodiment, the sensor may be a logical sensor having a digital output, the sensor having a switch that is connected in parallel to one of the first through third resistors, and the switch being either closed or open as a function of the detected status. The sensor may include a Hall-effect sensor, in particular.

In the following text exemplary embodiments of the present invention are explained in greater detail with reference to the appended drawings.

DETAILED DESCRIPTION

Figure 1:
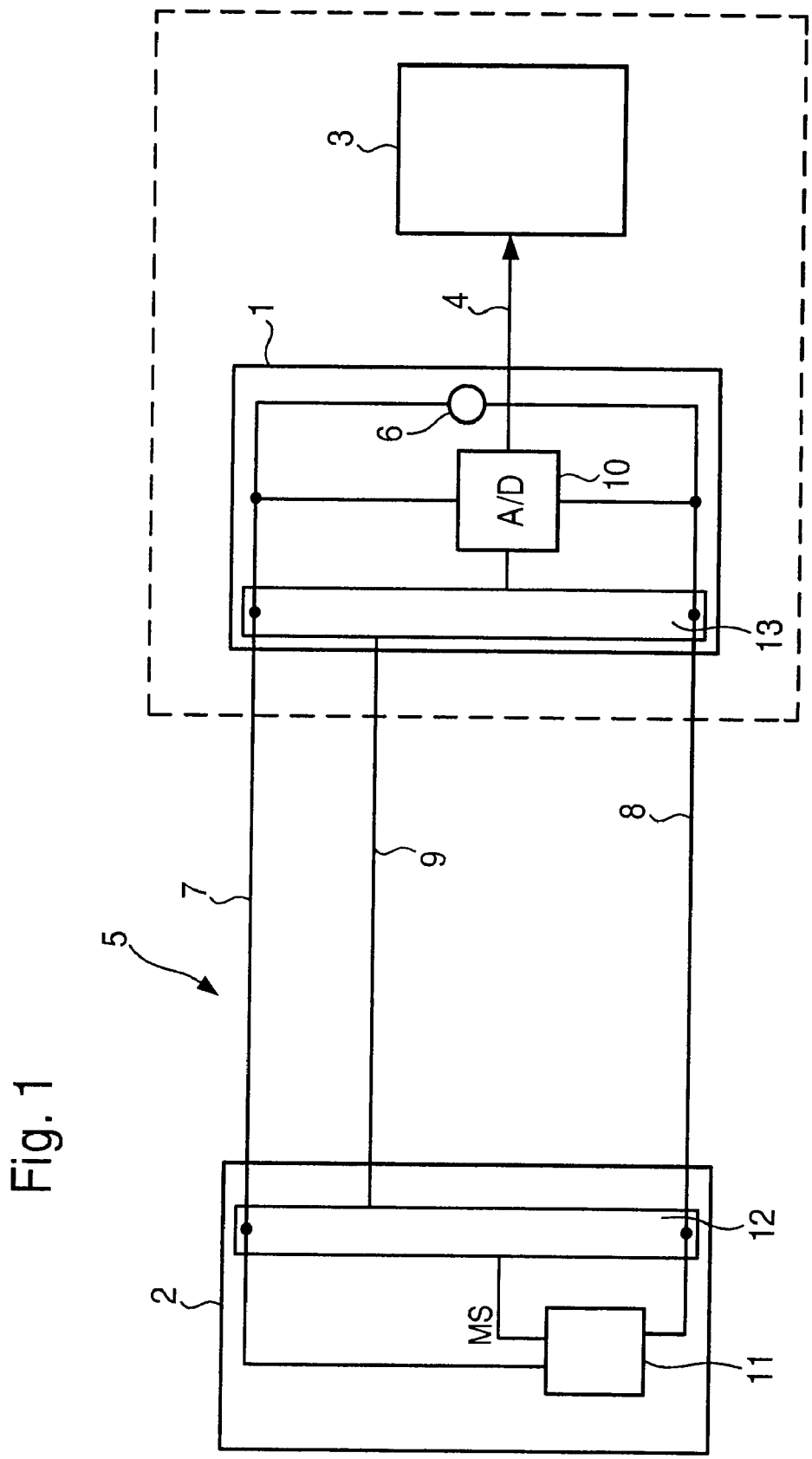
FIG. 1 shows a block diagram of a sensor system according to a first specific embodiment of the present invention.

FIG. 1 shows an electronic system, which includes an evaluation unit 1 for an externally disposed sensor unit 2, as well as a control unit 3 in a feedback control system R. Evaluation unit 1 detects a measuring value and makes it available to control unit 3 on an output line 4 as a control value, thereby enabling control unit 3 of the feedback control system to control an additional electronic device, for example, as a function of the control value.

Evaluation unit 1 is used to establish a connection to a sensor unit 2 that is disposed externally to the electronic system, via connection line 5. Such a separate set-up of feedback control system and sensor unit 2 is useful especially in rough environments in which measuring values must be acquired. To protect the electronics of the feedback control system, it is therefore disposed in a separate location from sensor unit 2.

A current supply of sensor unit 2 is ensured via a voltage source 6 in evaluation unit 1. To this end, evaluation unit 1 supplies to sensor unit 2 a first supply voltage potential on a first supply line 7 and a second supply potential on a second supply line 8. Sensor unit 2 provides an output measuring signal onto a sensor line 9, which is connected to a separate input of evaluation unit 1.

Evaluation unit 1 has an analog-digital converter 10, which generates the control value to be output on output line 4. Sensor unit 2 has a sensor 11, which generates a measuring signal MS as a function of a measured variable such as a temperature, pressure or some other variable.

Sensor 11 is connected to first and second supply line 7, 8, respectively, in order to provide a supply voltage to sensor 11. Sensor unit 2 has a first resistive circuit 12, which is connected to first and second supply line 7, 8, to sensor line 9 as well as to the output of sensor 11. Evaluation unit 1 includes a second resistive circuit 13, which is connected to the first and second supply line 7, 8, to sensor line 9 and to an input of analog-digital converter 10. First and second resistive circuit 12, 13 are therefore interconnected via first and second supply line 7, 8 as well as sensor line 9 and form a resistor network by their interconnection. In the fault-free operating state, this resistor network made up of first and second resistive circuit 12, 13 supplies a measuring potential at the input of the analog-digital converter which is a function of measuring signal MS at the output of sensor 11.

Furthermore, the resistor network is designed such that, in the fault case such as in an interruption of one of connection lines 5, a measuring potential is applied at analog-digital converter 10 that lies within a potential range which differs from the potential range in which the measuring potential lies during proper operation.

The resistor network may form a voltage divider, which is produced by the interconnection of the first and second resistive circuits 12, 13. If one of the connection lines between the two resistive circuits 12, 13 is interrupted, then this causes a change in the resistance ratios of the voltage divider, and the measuring potential at the input of analog-digital converter 10 adjusts to a potential that lies within a fault potential range, independently of the measuring signal, or only slightly dependent on the measuring signal. This makes it possible to determine that a fault has occurred and which type of fault is involved. Since sensor 11 is no longer operating properly in an interruption in one of first or second supply lines 7, 8, and since it is no longer possible to detect a measuring potential that is a function of the measuring signal of sensor 1 in an interruption of sensor line 9 on the other hand, the fault potential ranges in the illustrated exemplary embodiment are essentially independent of the status of sensor 11.

Furthermore, by suitable dimensioning of the first and second resistive circuits 12, 13, fault potential ranges for any possible fault case are able to be linked to different potential ranges, so that it is detectable on the basis of the measuring potential whether the status of connection lines to sensor unit 2 is free of faults or whether a fault is present in the form of an interruption of one of connection lines 5.

Short circuits between connection lines 5 are also able to be detected in this manner; in particular a short circuit between second supply line 8 and sensor line 9 is detectable so that, to distinguish the individual types of faults, it is advantageous to place the fault potential ranges into different potential ranges, starting from 0 V, in order to indicate the faults of interruptions of the connection lines.

Figure 2:
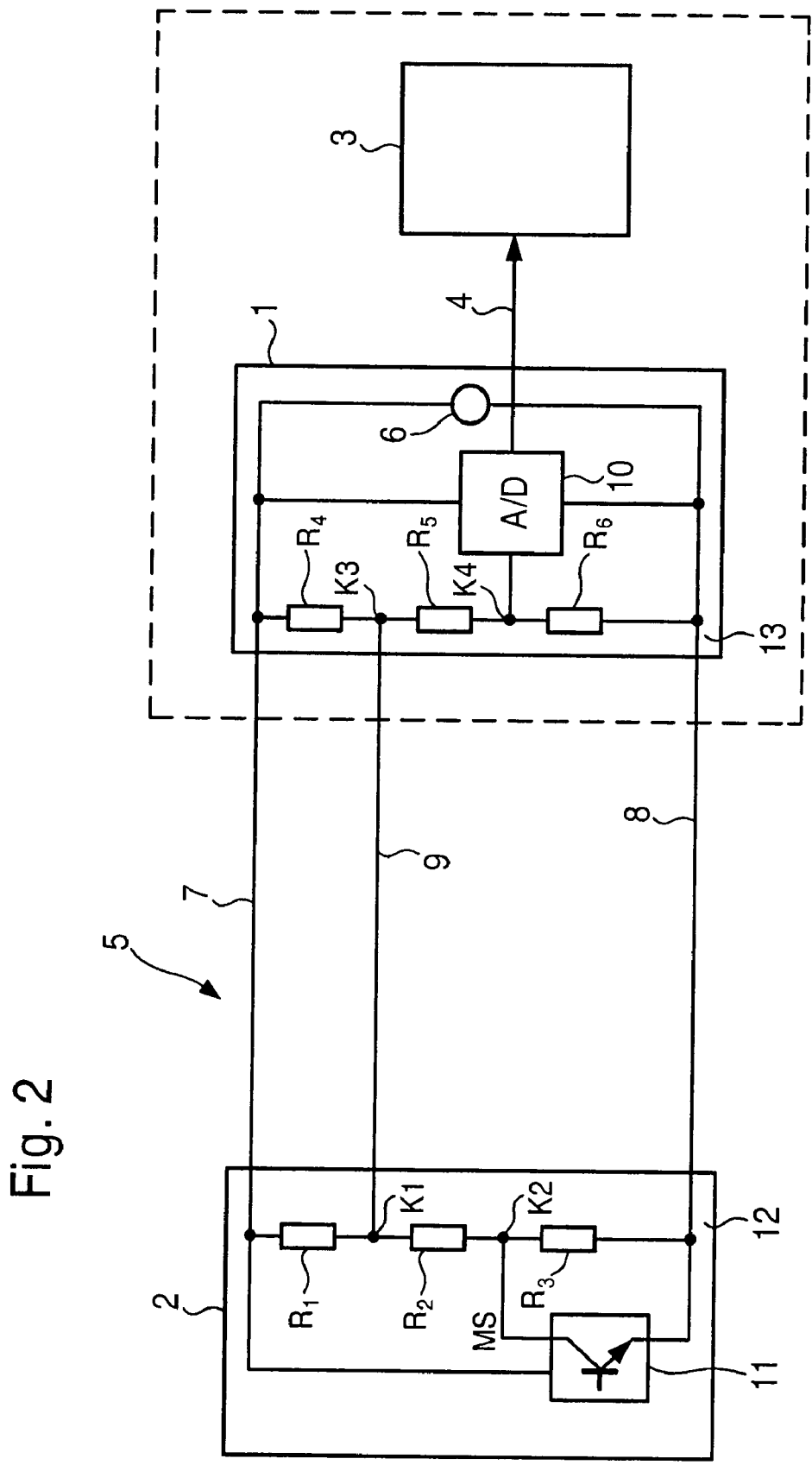
FIG. 2 shows a sensor system according to an additional specific embodiment of the present invention.

FIG. 2 shows a more detailed representation of one possible specific embodiment of the present invention. A Hall-effect sensor in the form of a Hall-IC, which has an open collector output, is provided as sensor 11. That is to say, depending on the measuring status of the Hall-effect sensor, the output is connected to the applied potential on second supply line 8 or switched to be highly resistive.

The first resistive circuit has a first resistor $R_1$, a second resistor $R_2$, and a third resistor $R_3$, which are connected in series between first supply line 7 and second supply line 8. A first node K1 between first and second resistor $R_1$, $R_2$ is connected to sensor line 9. A second node K2 between second resistor $R_2$ and third resistor $R_3$ is connected to the output of the Hall-effect sensor, which supplies measuring signal MS.

Second resistive circuit 13 of evaluation unit 1 has a fourth resistor $R_4$, a fifth resistor $R_5$, and a sixth resistor $R_6$, which are disposed in series between first supply line 7 and second supply line 8. A third node K3 between the fourth resistor and the fifth resistor $R_4$, $R_5$ is connected to sensor line 9. A fourth node K4, which is situated between fifth resistor $R_5$ and sixth resistor $R_6$, is connected to the input of analog-digital converter 10 in order to supply the measuring potential.

The resistor network formed by first resistive circuit 12 and second resistive circuit 13 is disposed in evaluation unit 1 and sensor unit 2 in distributed fashion, connection lines 5 bringing about a parallel connection of the resistors. For instance, first supply line 7 and sensor line 9 cause first resistor $R_1$ and fourth resistor $R_4$ to form an overall resistance in a voltage divider formed by the entire resistor network. If one of connection lines 5 is interrupted, then the parallel connection of the mutually corresponding resistors caused thereby is missing, so that the measuring potential at fourth node K4 jumps to a potential in a corresponding fault potential range that is independent of measuring signal MS of Hall-effect sensor 11 since this sensor is either not operative due to an interruption of first and second supply line 7, 8, or is no longer able to transmit the signal corresponding to the measuring signal to evaluation unit 1 in an interruption of sensor line 9.

Figure 3:
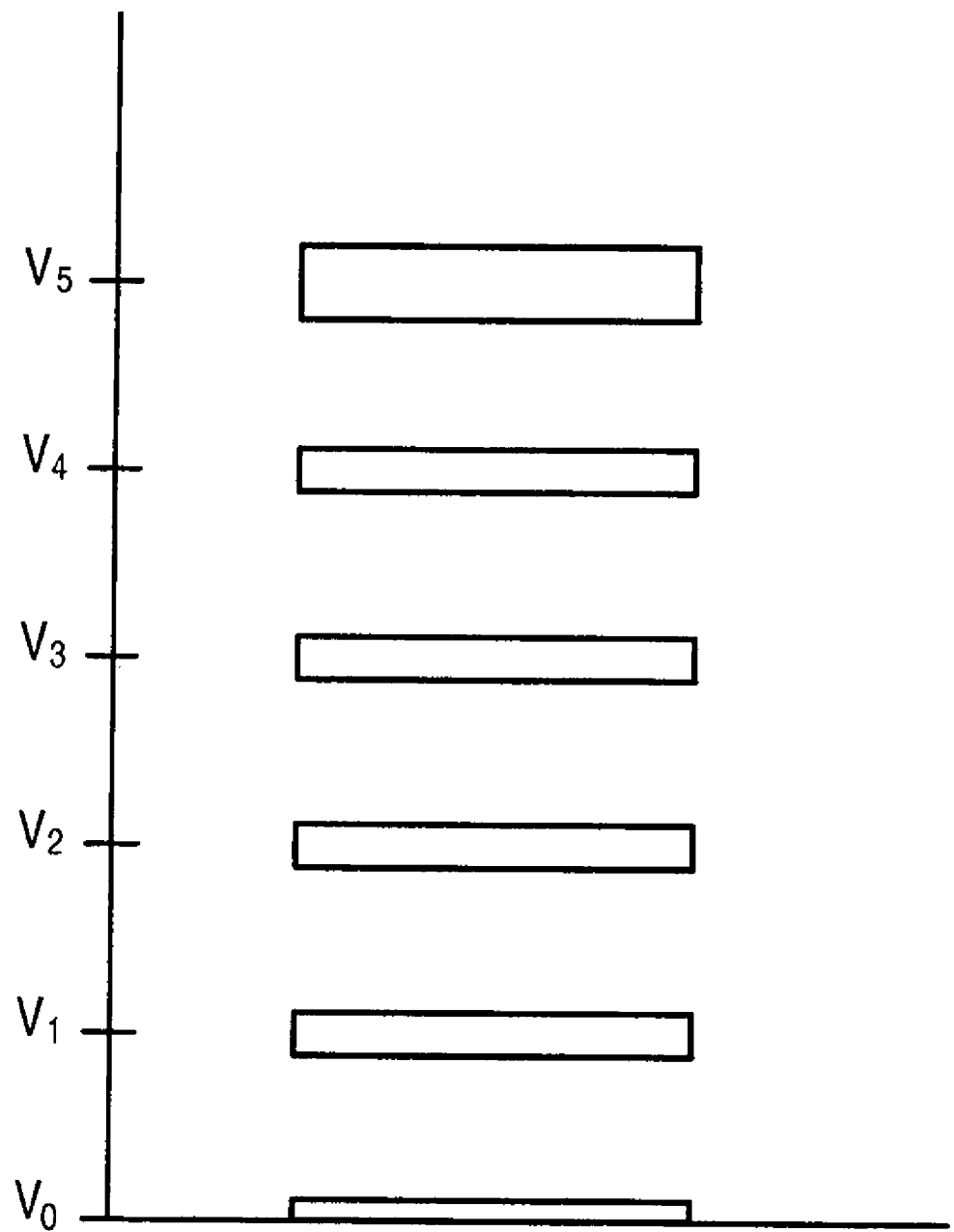
FIG. 3 shows the system of measuring and fault potential ranges in the specific embodiment of FIG. 2.

FIG. 3 shows exemplary potential ranges $V_1$-$V_6$ for measuring potentials in a fault-free operating state and also in the presence of possible interruptions of the three connection lines. Furthermore, a potential range at 0V is provided, which is assumed by the measuring potential if a short circuit has occurred between the sensor line or the first supply line and the second supply line. The potential ranges correspond to a specific potential variance resulting from tolerances and interference. If it is determined in the control unit that the measured measuring potential lies within such a range, then the state of the system assigned to the potential range will be assumed.

While the potential range marked by $V_0$ indicates that first supply line 7 or sensor line 9 is short-circuited with second supply line 8, the potential ranges marked by $V_1$ and $V_3$ indicate the ranges that correspond to the detection states of Hall-effect sensor 11 in the fault-free operating state. Potential range $V_1$ results from the following formula $$V_1 = V_{vers} * \frac{R_6}{R_5 + R_6} * \frac{R_2 \| (R_5 + R_6)}{R_1 \| R_4 + R_2 \| (R_5 + R_6)},$$

and potential range $V_3$ results from:

$$V_3 = V_{vers} * \frac{R_6}{R_5 + R_6} * \frac{(R_2 + R_3) \| (R_5 + R_6)}{R_1 \| R_4 + (R_2 + R_3) \| (R_5 + R_6)},$$

the output of Hall-effect sensor 11 being switched to be highly resistive. Potential range $V_3$ results from the state of Hall-effect sensor 11 in which the output connection is applied to the potential of second supply line 8, such as a measuring potential.

Potential range $V_2$ is a fault potential range, which indicates an interruption of first supply line 7. Potential range $V_2$ results from the following formula:

$$V_2 = V_{vers} * \frac{R_6}{R_5 + R_6} * \frac{(R_2 + R_3) \| (R_5 + R_6)}{R_4 + (R_2 + R_3) \| (R_5 + R_6)}$$

If sensor line 9 is interrupted, then the measuring potential is within potential range $V_4$, which is able to be determined according to the following formula:

$$V_4 = V_{vers} * \frac{R_6}{R_4 + R_5 + R_6}$$

A potential in potential range $V_5$ is measured if second supply line 8 is interrupted. Potential range $V_5$ results from the formula:

$$V_5 = V_{vers} * \frac{R_6}{(R_5 + R_6 + (R_1 \| R_4))}$$

The resistance values of resistors $R_1$ through $R_6$ may be selected such that none of the potential ranges intersects or overlaps.

The exemplary embodiment illustrated here includes a sensor which outputs only two output states. However, it is also possible to use a sensor 11 which outputs an analog measuring signal in a specific range. The resistance values of resistors $R_1$ through $R_6$ may be specified in such a way that no fault potential range lies within this measuring potential range specified by the measuring signal, so that a clear distinction between proper operation and fault case is possible on the basis of the measuring potential.

The aforementioned calculation formulas for determining potential ranges merely indicate the arithmetic average value of the potential ranges; no collector saturation current of the Hall-effect transistor is considered, the spread of the ranges being defined by tolerances and interference. In selecting the resistance values, care should be taken that the fault potential ranges or the measuring potential ranges do not overlap.

To this end, it is possible, for instance, to provide the potential ranges, determined by the aforementioned formulas by their average value, with a tolerance range, which is defined by the requirements that the individual potential ranges must have a specific clearance from each other. Possible combinations of resistances may be determined iteratively or by trial and error. Given a specified range of the particular potential range of 0.1 V, as is the case in the exemplary embodiment shown here, it is possible, for example, to determine resistor values $R_1$ through $R_6$ with the aid of the following inequation:

$$V_1 +/- 0.05 < V_2 +/- 0.05V < V_3 +/- 0.05V < V_4 +/- 0.05 < V_5 +/- 0.05V.$$

From such an inequation, possible combinations of resistance values for the first through sixth resistors are able to be determined iteratively. For example, the amounts of the resistances may have the following values: $R_1 = 2.15$ k$\Omega$, $R_2 = 1$ k$\Omega$, $R_3 = 3.09$ k$\Omega$, $R_4 = 825 \Omega$, $R_5 = 1.5$ k$\Omega$ and $R_6 = 75 \Omega$.

Resistive circuits 12, 13 may also be configured in some other manner, but it is important that the two resistive circuits 12, 13 form a resistor network, which has different effects on a measuring potential depending on the possible fault case. In particular, however, it is desirable that both first supply line 7 and second supply line 8 do not exhibit any resistance, if possible, so that no fundamental drop in the supply voltage occurs up to sensor unit 2.

The following table provides guidance in the adjustment or in the selection of resistors $R_1$ through $R_6$; the effect of a modification of the resistance, listed in the lines, to the corresponding potential ranges indicated as column headers is represented by the size of the letters. k denotes a reduction in the resistance value, and g an increase. To identify an especially negligible influence of a modification of the resistance value, the letters g and k have been placed in parentheses.

| variation | Effect on voltage | | | | |
|---|---|---|---|---|---|
| of R (k g) | $V_1$ | $V_2$ | $V_3$ | $V_4$ | $V_5$ |
| 1 | (g k) | | g k | | (g k) |
| 2 | k g | (k g) | k g | | |
| 3 | k g | k g | | | |
| 4 | | g k | g k | g k | g k |
| 5, 6 | (k g) | | (k g) | k g | k g |

To begin with, resistances $R_1$, $R_3$ through $R_6$ are specified; the resistance values of resistors $R_1$ and $R_4$ are selected to be identical, so that the voltage at node K4 is lower than a reference voltage of the A/D converter in order to also be able to detect the status of a short circuit of the sensor line to the first supply line. Subsequently, the resistance value of resistor $R_2$ is specified in order to set the potential range for a first detection state, i.e., to set potential range $V_3$, and then the resistance value of resistor $R_3$ is specified for a second detection state, which is indicated by potential range $V_1$. The resistance values of the resistors that have the greatest possible effect on the potential range to be gathered from the table, may then be varied with the aid of the aforementioned table, in order to achieve satisfactory separation of the potential ranges for the various fault states.

What is claimed is:

1. A sensor system comprising:
   a sensor unit for detecting a measured variable; and
   an evaluation unit connected to the sensor unit via at least one connection line;
   wherein the sensor unit includes a sensor, which has a signal output for a measuring signal that is a function of the measured variable,
   wherein the evaluation unit includes a voltage detector for detecting a status of the measured variable as a function of a potential,
   wherein the sensor unit includes a first resistive circuit, which is connected to the sensor, and the evaluation unit includes a second resistive circuit, which is connected to the voltage detector,
   wherein the first resistive circuit and the second resistive circuit are coupled to one another via the at least one connection line, and form a resistor network, and
   wherein the first resistive circuit and the second resistive circuit are configured so that, in a fault-free state of the at least one connection line, the voltage detector detects at least one measuring potential in at least one defined measuring potential range as a function of the measured variable, and, in a fault case, the voltage detector detects a measuring potential that lies within a fault potential range, which lies outside the at least one defined measuring potential range;
   wherein the sensor unit and the evaluation unit are interconnected via a sensor line, a first supply line and a second supply line;
   wherein the first resistive circuit includes a first resistor element, a second resistor element, and a third resistor element, which are connected in series between the first supply line and the second supply line, a first node between the first resistor element and the second resistor element being connected to the sensor line, and a second node between the second resistor element and the third resistor element being connected to the signal output of the sensor.

2. The sensor system of claim 1, wherein at least one of the first resistive circuit and the second resistive circuit are configured as a resistor chain.

3. The sensor system of claim 1, wherein the first resistive circuit and the second resistive circuit are configured so that, in a plurality of fault cases, it is detectable by a plurality of measuring potentials in a corresponding plurality of fault potential ranges to detect a type of a particular fault.

4. The sensor system of claim 3, wherein the first resistive circuit and the second resistive circuit are configured so that, if one of the connection lines is interrupted, the voltage detector detects a measuring potential that lies within a fault potential range assigned to the type of the fault.

5. The sensor system of claim 1, wherein the first resistive circuit and the second resistive circuit are arranged as resistor chains, which are interconnected at different nodes via the sensor line and the first supply line and the second supply line, and wherein resistor elements of a resistor network are dimensioned so that, in an interruption in one of the connection lines, the measuring potential is set to a corresponding fault potential range.

6. The sensor system of claim 1, wherein the second resistive circuit includes a fourth resistor element, a fifth resistor element, and a sixth resistor element, which are connected in series between the first supply line and the second supply line, a third node between the fourth resistor element and the fifth resistor element being connected to the sensor line, and a fourth node between the fifth resistor element and the sixth resistor element being connected to the voltage detector.

7. The sensor system of claim 6, wherein the first through sixth resistor elements are dimensioned so that the faults by interruption of one of the connection lines is identifiable in an unambiguous manner based on the fault potential range in which the measuring potential lies.

8. The sensor system of claim 6, wherein the first through sixth resistor elements are dimensioned so that the faults by short-circuiting of one of the sensor lines with a fixed potential is identifiable in an unambiguous manner based on the measuring potential.

9. The sensor system of claim 1, wherein the sensor is a logical sensor having a digital output, the sensor having a switch that is connected in parallel to one of the first through third resistors, and which is either closed or open as a function of the sensor state.

10. The sensor system of claim 1, wherein the sensor includes a Hall-effect sensor.

* * * * *